United States Patent
Long et al.

(10) Patent No.: US 11,255,924 B2
(45) Date of Patent: Feb. 22, 2022

(54) SOCKET DETECTION APPARATUS AND METHOD FOR SUPPORTING ANOMALY DETECTION OF EARTH WIRE AND NEUTRAL WIRE

(71) Applicant: Uni-Trend Technology (China) Co., Ltd., Guangdong (CN)

(72) Inventors: Jizhi Long, Guangdong (CN); Benny Siu Lam Hung, Guangdong (CN); Weikun Han, Guangdong (CN); Zhanhua Jin, Guangdong (CN); Deng Zhang, Guangdong (CN); Shengjun Qiu, Guangdong (CN); Yongsong Lu, Guangdong (CN)

(73) Assignee: Uni-Trend Technology (China) Co., Ltd., Dongguan (CN)

( * ) Notice: Subject to any disclaimer, the term of this patent is extended or adjusted under 35 U.S.C. 154(b) by 0 days.

(21) Appl. No.: 17/356,508

(22) Filed: Jun. 23, 2021

(65) Prior Publication Data
US 2021/0405128 A1    Dec. 30, 2021

(30) Foreign Application Priority Data
Jun. 24, 2020 (CN) .......................... 202010585160.2

(51) Int. Cl.
| | | |
|---|---|---|
| *G01R 31/69* | (2020.01) | |
| *G01R 31/54* | (2020.01) | |
| *G01R 27/20* | (2006.01) | |
| *H01R 13/66* | (2006.01) | |
| *H01R 13/717* | (2006.01) | |

(52) U.S. Cl.
CPC ............ *G01R 31/69* (2020.01); *G01R 27/20* (2013.01); *G01R 31/54* (2020.01); *H01R 13/6683* (2013.01); *H01R 13/7175* (2013.01)

(58) Field of Classification Search
CPC ........ G01R 31/69; G01R 31/54; G01R 27/20; H01R 13/7175; H01R 13/6683
See application file for complete search history.

(56) References Cited

U.S. PATENT DOCUMENTS

| | | | | |
|---|---|---|---|---|
| 6,337,569 B1* | 1/2002 | Ikake | ................... | G01R 19/155 |
| | | | | 324/508 |
| 2012/0170159 A1* | 7/2012 | Huang | ................... | G01R 31/52 |
| | | | | 361/42 |
| 2020/0328586 A1* | 10/2020 | Eriksen | .................. | H02H 3/335 |

FOREIGN PATENT DOCUMENTS

| | | | | |
|---|---|---|---|---|
| CN | 206832925 U | * | 1/2018 | ............. G01R 31/04 |
| CN | 206832925 U | | 1/2018 | |
| CN | 107703414 A | | 2/2018 | |

* cited by examiner

*Primary Examiner* — Akm Zakaria

(57) ABSTRACT

A socket detection apparatus for supporting anomaly detection of an earth wire and a neutral wire includes: a micro-control unit, provided with a test plug of a fire wire connection end, a neutral wire connection end and an earth wire connection end, and a detection circuit connected with the test plug; and an induction antenna arranged corresponding to a fire wire end of a detected power socket, the induction antenna being connected with a first signal input end of the micro-control unit.

8 Claims, 1 Drawing Sheet

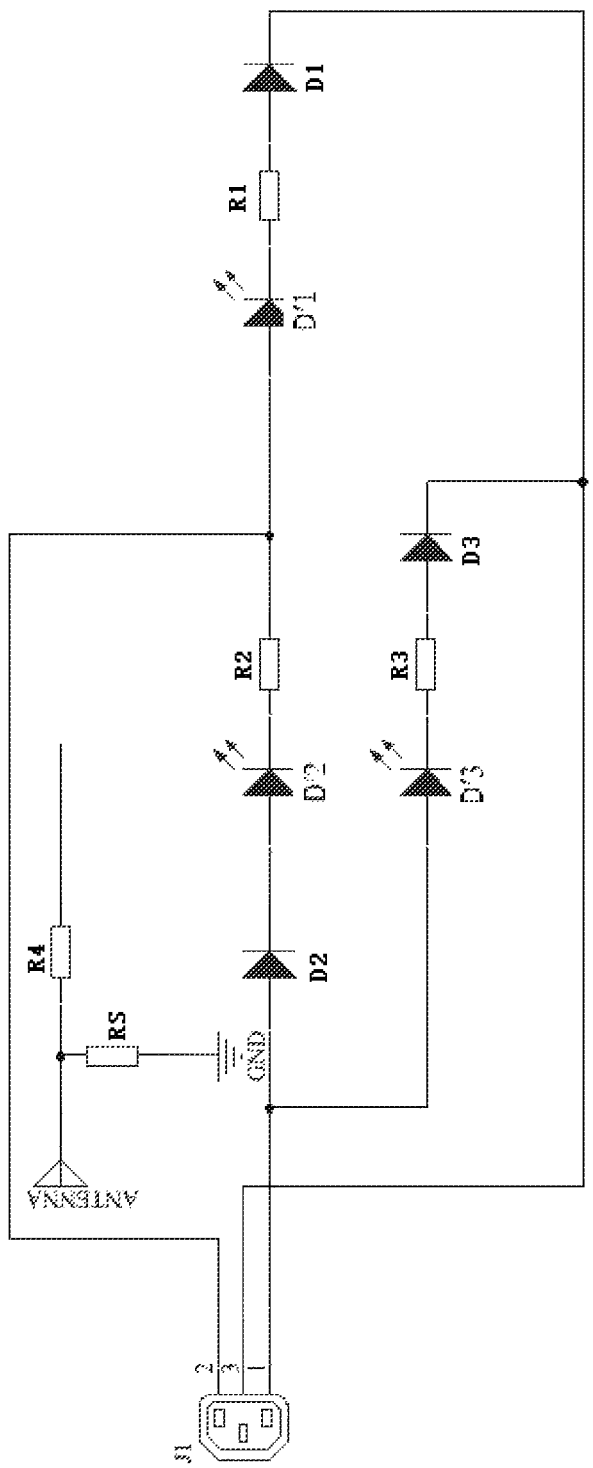

SOCKET DETECTION APPARATUS AND METHOD FOR SUPPORTING ANOMALY DETECTION OF EARTH WIRE AND NEUTRAL WIRE

CROSS REFERENCE TO RELATED APPLICATIONS

The present application claims the benefit of Chinese Patent Application No. 202010585160. 2 filed on Jun. 24, 2020, the contents of which are incorporated herein by reference in their entirety.

TECHNICAL FIELD

The disclosure relates to the field of power socket detection, and in particular to a socket detection apparatus and method for supporting anomaly detection of earth wire and neutral wire.

BACKGROUND

At present, the function of an electroscope with a power frequency of 220V/50 Hz, or a power socket polarity detector is limited to the following seven states at most: first, a fire wire, a neutral wire and an earth wire are connected correctly; second, there is lack of the neutral wire; third, there is lack of the earth wire; fourth, there is lack of the fire wire; fifth, the fire wire and the earth wire are connected to the other's positions; sixth, the fire wire and the neutral wire are connected to the other's positions; and seventh, the fire wire and the earth wire are connected to the other's positions, and there is lack of the earth wire. But in fact, there are two important states for which no company has yet made an achievable product. One of the two important states is that there is only the fire wire, and there is lack of the neutral wire and the earth wire, the other is that the neutral wire and the earth wire are connected to the other's positions. For the detection of the above two states, existing products are helpless.

The missing detection of the above two states is accompanied by a great potential safety hazard. When the power socket only has the fire wire and is lack of the neutral wire and the earth wire, the fire wire is still alive, because the neutral wire and the earth wire are open, the current power socket polarity detector cannot be connected to detect this state, and a user mistakenly thinks the socket is out of power to operate at ease, but in fact, it is very dangerous and the user is very likely to be shocked. When the neutral wire and the earth wire of the power socket are connected to the other's positions, because it can be connected normally, the alarm indication of the current power socket polarity detector during detection is the same as that of the power socket when it is normal, this state cannot be recognized too, the first harm of which is that a device connected cannot operate, followed by an electric shock occurring on the shell of the device.

So, the detection on whether the power socket is in the state that there is only the fire wire, and is lack of neutral wire and earth wire, or the neutral wire and the earth wire are connected to the other's positions is especially important, and the above two states may be summarized as the anomaly of the earth wire and the neutral wire. So, the market is in urgent need of a socket detection apparatus for supporting anomaly detection of an earth wire and a neutral wire to fill the gap in this field, so as to protect the personal safety of operators.

Technical Problems

How to overcome the technical problem of hidden danger of a power socket caused by the anomaly of an earth wire and a neutral wire.

SUMMARY

To overcome the above technical problem, the disclosure discloses a socket detection apparatus and method for supporting anomaly detection of an earth wire and a neutral wire.

The technical solution adopted by the disclosure to achieve the above purpose is as follows.

A socket detection apparatus for supporting anomaly detection of an earth wire and a neutral wire includes: a micro-control unit, provided with a test plug of a fire wire connection end, a neutral wire connection end and an earth wire connection end, and a detection circuit connected with the test plug; and an induction antenna arranged corresponding to a fire wire end of a detected power socket, the induction antenna being connected with a first signal input end of the micro-control unit.

The detection circuit includes a fire wire test sub-circuit, a neutral wire test sub-circuit and an earth wire test sub-circuit respectively connected with the fire wire connection end, the neutral wire connection end and the earth wire connection end, and the fire wire test sub-circuit, the neutral wire test sub-circuit and the earth wire test sub-circuit are connected in turn to form a loop.

The fire wire test sub-circuit includes a first light emitting diode, a first protective resistor and a first rectifier diode serially connected in turn. The positive electrode of the first light emitting diode is connected with the fire wire connection end, and the negative electrode of the first rectifier diode is connected with the earth wire test sub-circuit. The neutral wire test sub-circuit includes a second rectifier diode, a second light emitting diode and a second protective resistor serially connected in turn. The positive electrode of the second rectifier diode is connected with the neutral wire connection end, and the input end of the first light emitting diode is also connected with the input end of the second protective resistor. The earth wire test sub-circuit includes a third light emitting diode, a third protective resistor and a third rectifier diode serially connected in turn. The negative electrode of the third rectifier diode is connected with the earth wire connection end, and the positive electrode of the second rectifier diode is also connected with the positive electrode of the third light emitting diode.

Resistance values of the fire wire test sub-circuit, the neutral wire test sub-circuit and the earth wire test sub-circuit are the same.

The induction antenna is connected with the first signal input end of the micro-control unit through a fourth protective resistor, and there is also an earthed signal attenuation resistor connected at the input end of the fourth protective resistor.

A first signal output end of the micro-control unit is connected with an indicator light for indicating the opening of the neutral wire and the earth wire, and a second signal output end of the micro-control unit is connected with an indicator light for indicating that the neutral wire and the earth wire are connected to the other's positions.

The fire wire test sub-circuit, the neutral wire test sub-circuit, the earth wire test sub-circuit are connected with the fire wire connection end, the neutral wire connection end and the earth wire connection end respectively through a first MOS transistor switch, a second MOS transistor switch and a third MOS transistor switch. Grid electrodes of the first MOS transistor switch, the second MOS transistor switch and the third MOS transistor switch are respectively connected with a first control output end, a second control output end and a third control output end of the micro-control unit.

The apparatus further includes a Hall sensor arranged corresponding to the detection circuit. The Hall sensor is connected with a second signal input end of the micro-control unit. The induction antenna is also connected with an analogue-to-digital converter, which is connected with the first signal input end of the micro-control unit.

A method for anomaly detection of an earth wire and a neutral wire implemented by the above socket detection apparatus for supporting anomaly detection of an earth wire and a neutral wire includes the following operations.

An initial value is preset, the induction antenna samples a test environment, a self-check AD initial value is obtained after conversion by the analogue-to-digital converter, and the self-check AD initial value and the initial value to are added to obtain a preset threshold.

A test plug of a power polarity detector is inserted into the detected power socket, a current value of the detection circuit is obtained through the Hall sensor, and it is determined whether the current value is greater than a preset current.

If the current value is less than or equal to the preset current, the induction antenna samples the fire wire end of the detected power socket, and voltage information is obtained after conversion by the analogue-to-digital converter.

When the voltage information is greater than the preset threshold, it is determined that the neutral wire and the earth wire of the detected power socket are open, and the indicator light for indicating the opening of the neutral wire and the earth wire is switched on.

When it is determined whether the current value is greater than the preset current, the method further includes the following operations.

If the current value is greater than the preset current, the first MOS transistor switch and the third MOS transistor switch are controlled to be on, the fire wire test sub-circuit is sampled through the induction antenna, and a first comparison voltage is obtained after conversion by the analogue-to-digital converter.

The second MOS transistor switch is controlled to be on and the third MOS transistor switch is controlled to be off, the neutral wire test sub-circuit is sampled through the induction antenna, and a second comparison voltage is obtained after conversion by the analogue-to-digital converter.

When the second comparison voltage is greater than the first comparison voltage, it is determined that the neutral wire and the earth wire of the detected power socket are connected to the other's positions, and the indicator light for indicating that the neutral wire and the earth wire are connected to the other's positions is switched on.

Beneficial Effects

The structure design of the disclosure is reasonable and ingenious. Through the method for anomaly detection of the earth wire and the neutral wire and the socket detection apparatus, the anomaly detection of the earth wire and the neutral wire is completed automatically, and the detection on whether the power socket is in the state that there is only the fire wire, and is lack of neutral wire and earth wire, or the neutral wire and the earth wire are connected to the other's positions is realized. At the same time, the disclosure is applicable to power systems of 220V/50 Hz of the national standard, and 110V of the U.S./Japan. In addition to seven power socket states that the current socket detection apparatus can detect at most, the disclosure also supports the anomaly detection of the earth wire and the neutral wire of the power socket, which fills the market gap, and comprehensively guarantees the personal safety of personnel.

BRIEF DESCRIPTION OF THE DRAWINGS

The disclosure is further explained below in combination with the accompanying drawings and embodiments.

The sole figure is a schematic circuit diagram of a socket detection apparatus for supporting anomaly detection of an earth wire and a neutral wire in an embodiment of the disclosure.

DETAILED DESCRIPTION OF THE EMBODIMENTS

In order to make the purpose, technical solutions and advantages of the disclosure clearer, implementation modes of the disclosure will further be described below in combination with the drawings in detail.

With reference to the sole figure, a socket detection apparatus for supporting anomaly detection of an earth wire and a neutral wire provided by an embodiment includes: a micro-control unit, provided with a test plug of a fire wire connection end 2, a neutral wire connection end 1, an earth wire connection end 3, and a detection circuit connected with the test plug; and an induction antenna ANTENNA arranged corresponding to a fire wire end of a detected power socket, the induction antenna being connected with a first signal input end of the micro-control unit.

Specifically, the material of the fire wire connection end 2, the neutral wire connection end 1 and the earth wire connection end 3 is an electric material. During the detection, by inserting the fire wire connection end 2, the neutral wire connection end 1 and the earth wire connection end 3 into a fire wire hole, a neutral wire hole and an earth wire hole of the detected power socket J1, the detection circuit is connected with the fire wire, the neutral wire and the earth wire of the detected power socket, so as to detect and determine seven states as follows: the fire wire, the neutral wire and the earth wire are connected correctly; there is lack of the neutral wire; there is lack of the earth wire; there is lack of the fire wire; the fire wire and the earth wire are connected to each other's positions; the fire wire and the neutral wire are connected to each other's positions; and the fire wire and the earth wire are connected to each other's positions, and there is lack of the earth wire.

In addition, through the setting of the induction antenna and the micro-control unit, it is determined whether the detected power socket is lack of the neutral wire and the earth wire by means of determining that the detection circuit cannot conduct when it is connected to the detected power socket and using the induction antenna to obtain a voltage value that can be acquired only when the fire wire is connected; and then it is determined that whether the neutral wire and the earth wire of the detected power socket are connected to each other's positions by means of comparing the voltage values measured when the detected circuit is connected respectively with the fire wire, the neutral wire/fire wire, and the earth wire of the detected power socket. In this way, the detection on whether the power socket is in the state that there is only the fire wire, and is lack of neutral wire and earth wire, or the neutral wire and the earth wire are connected to each other's positions is realized, that is, anomaly detection of the earth wire and the neutral wire is realized through the socket detection apparatus. So, the socket detection apparatus can not only realize the detection on seven power socket states that the current socket detection apparatus can detect at most, but also support the anomaly detection of the earth wire and the neutral wire of the power socket, which fills the market gap, and comprehensively guarantees the personal safety of personnel.

The detection circuit includes a fire wire test sub-circuit, a neutral wire test sub-circuit and an earth wire test sub-circuit respectively connected with the fire wire connection end 2, the neutral wire connection end 1 and the earth wire connection end 3, and the fire wire test sub-circuit, the neutral wire test sub-circuit and the earth wire test sub-circuit are connected in turn to form a loop.

Specifically, the fire wire connection end 2, the neutral wire connection end 1 and the earth wire connection end 3 are in a shape of long strip.

Furthermore, the socket detection device supporting anomaly detection of an earth wire and a neutral wire further includes an insulating shell. The insulating shell is internally provided with independent first circuit accommodating cavity, second circuit accommodating cavity, and third circuit accommodating cavity. The fire wire test sub-circuit, the neutral wire test sub-circuit and the earth wire test sub-circuit are respectively arranged in the first circuit accommodating cavity, the second circuit accommodating cavity, and the third circuit accommodating cavity, and are connected with the fire wire connection end 2, the neutral wire connection end 1 and the earth wire connection end 3.

First antenna guide slot for the induction antenna ANTENNA to slips are arranged in the first circuit accommodating cavity, the second circuit accommodating cavity and the third circuit accommodating cavity. The fire wire connection end 2 of the test plug is provided with a second antenna guide slot for the induction antenna ANTENNA to slip.

A knob corresponding to the first circuit accommodating cavity, the second circuit accommodating cavity and the third circuit accommodating cavity, a knob is provided. The knob is provided with at least four gears corresponding to the second antenna guide slot and the three first antenna guide slots. The induction antenna ANTENNA is connected with the knob through a telescoping mechanism.

The knob is driven by a steering drive device to rotate. The telescoping mechanism is driven by a telescopic drive mechanism to do telescopic motion, and the steering drive device and the telescopic drive mechanism are respectively connected to a third signal output end and a fourth signal output end of the micro-control unit.

In the present embodiment specifically, the telescoping mechanism is a common piston rod, the telescopic drive mechanism is a telescopic cylinder, and the steering drive device is a steering cylinder.

Furthermore, according to a control signal sent by the micro-control unit, the induction antenna ANTENNA can be driven, through the cooperation of the knob and the telescoping mechanism, to move to the first antenna guide slot or the second antenna guide slot, so that the subsequent method for anomaly detection of an earth wire and a neutral wire can be implemented.

The micro-control unit is powered by a 3V power supply IC.

In addition, there is at least an electrical gap greater than 1 mm between the induction antenna ANTENNA and the fire wire end of the detected power socket, which can resist an electric field signal of 1 KV of the fire wire, so as to avoid the potential safety hazard during detection caused by the excessively large electric field signal of the fire wire. In the present embodiment, the induction antenna ANTENNA is wrapped by an insulating antenna casing to achieve an electrical clearance of at least 1 mm.

The fire wire test sub-circuit includes a first light emitting diode D'1, a first protective resistor R1 and a first rectifier diode D1 serially connected in turn. The positive electrode of the first light emitting diode D'1 is connected with the fire wire connection end 2, and the negative electrode of the first rectifier diode D1 is connected with the earth wire test sub-circuit. The neutral wire test sub-circuit includes a second rectifier diode D2, a second light emitting diode D'2 and a second protective resistor R2 serially connected in turn. The positive electrode of the second rectifier diode D2 is connected with the neutral wire connection end 1, and the input end of the first light emitting diode D'1 is also connected with the output end of the second protective resistor R2. The earth wire test sub-circuit includes a third light emitting diode D'3, a third protective resistor R3 and a third rectifier diode D3 serially connected in turn. The negative electrode of the third rectifier diode D3 is connected with the earth wire connection end 3, and the positive electrode of the second rectifier diode D2 is also connected with the positive electrode of the third light emitting diode D'3. In this way, a situation that the normal state and the state of being lack of the earth wire are displayed the same can be effectively avoided.

Specifically, a resistance value of the first protective resistor R1, the second protective resistor R2 and the third protective resistor R3 is 90 kilo-ohms.

During the detection, if the fire wire, the neutral wire and the earth wire are corrected correctly, the fire wire test sub-circuit and the neutral wire test sub-circuit conduct at a positive half cycle of alternating current, and the first light emitting diode D'1 and the second light emitting diode D'2 are switched on.

If there is lack of the neutral wire, and only the fire wire has a voltage to the earth wire, then the fire wire test sub-circuit conducts at the positive half cycle of alternating current, and the first light emitting diode D'1 is switched on; in this case, the neutral test sub-circuit and the earth wire test sub-circuit are equivalent to being connected to the fire wire and the earth wire in parallel after being connected in series, but the second light emitting diode D'2 and the third light emitting diode D'3 are connected in series, and the effective resistance is doubled, so the light emitted by the second light emitting diode D'2 and the third light emitting diode D'3 is very weak to be seen hardly.

If there is lack of the earth wire, and only the fire wire has a voltage to the neutral wire, then the neutral wire test sub-circuit conducts at a negative half cycle of alternating current, and the second light emitting diode D'2 is switched on.

If there is lack of the fire wire, and the voltage of the fire wire to the neutral wire and the earth wire is 0, then the fire wire test sub-circuit, the neutral wire test sub-circuit and the earth wire test sub-circuit all break, and neither the first light emitting diode D'1 nor the second light emitting diode D'2 is switched on.

If the fire wire and the earth wire are connected to each other's positions, then the fire wire test sub-circuit and the earth wire test sub-circuit conduct at the negative half cycle of alternating current, and the first light emitting diode D'1 and the third light emitting diode D'3 are switched on.

If the fire wire and the neutral wire are connected to each other's positions, then the neutral wire test sub-circuit and the earth wire test sub-circuit conduct at the positive half cycle of alternating current, and the second light emitting diode D'2 and the third light emitting diode D'3 are switched on.

If the fire wire and the earth wire are connected to each other's positions, and there is lack of the earth wire, then the earth wire test sub-circuit conducts at the negative half cycle of alternating current, and the third light emitting diode D'3 is switched on.

Resistance values of the fire wire test sub-circuit, the neutral wire test sub-circuit and the earth wire test sub-circuit are the same.

Specifically, the resistance values of the fire wire test sub-circuit, the neutral wire test sub-circuit and the earth wire test sub-circuit are the same, which may ensure that the electric fields generated by the fire wire test sub-circuit, the neutral wire test sub-circuit and the earth wire test sub-circuit are the same when connected to the same voltage. In this way, the interference caused by different electric fields due to different resistance values can be reduced when the detection on the state that the neutral wire and the earth wire are connected to each other's positions is implemented, thereby improving the detection accuracy.

The induction antenna ANTENNA is connected with the first signal input end of the micro-control unit through a fourth protective resistor R4, and there is also an earthed GND signal attenuation resistor R5 connected at the input end of the fourth protective resistor R4.

Specifically, the resistance value of the earthed signal attenuation resistor R5 is 50 megohms, so as to avoid a measuring antenna from a suspension state, and thus overcome the defect that the measuring antenna in a suspension state is easily interfered, resulting in an unstable function state. Then, the measurement stability of the socket detection apparatus is effectively improved.

A first signal output end of the micro-control unit is connected with an indicator light for indicating the opening of the neutral wire and the earth wire, and a second signal output end of the micro-control unit is connected with an indicator light for indicating that the neutral wire and the earth wire are connected to the other's positions.

Specifically, when it is determined that the neutral wire and the earth wire are open, the indicator light for indicating the opening of the neutral wire and the earth wire is controlled through the micro-control unit to be switched on; and when it is determined that the neutral wire and the earth wire are connected to the other's positions, the indicator light for indicating that the neutral wire and the earth wire are connected to the other's positions is controlled through the micro-control unit to be switched on.

The micro-control unit can be a single chip microcomputer, a CPU and other chips with a logic operation function, a control function and a memory function.

The fire wire test sub-circuit, the neutral wire test sub-circuit, the earth wire test sub-circuit are connected with the fire wire connection end, the neutral wire connection end and the earth wire connection end respectively through a first MOS transistor switch, a second MOS transistor switch and a third MOS transistor switch. Grid electrodes of the first MOS transistor switch, the second MOS transistor switch and the third MOS transistor switch are respectively connected with a first control output end, a second control output end and a third control output end of the micro-control unit.

The apparatus further includes a Hall sensor arranged corresponding to the detection circuit. The Hall sensor is connected with a second signal input end of the micro-control unit. The induction antenna is also connected with an analogue-to-digital converter, which is connected with the first signal input end of the micro-control unit.

Specifically, the analogue-to-digital converter may be embedded in the micro-control unit, or the micro-control unit with an analogue-to-digital conversion function is directly adopted.

A method for anomaly detection of an earth wire and a neutral wire implemented by the above socket detection apparatus for supporting anomaly detection of an earth wire and a neutral wire includes the following operations.

An initial value is preset, the induction antenna samples a test environment, a self-check AD initial value is obtained after conversion by the analogue-to-digital converter, and the self-check AD initial value and the initial value to are added to obtain a preset threshold.

Specifically, the AD value refers to ADC conversion and is a sampling value of the analogue-to-digital converter. In the present embodiment specifically, the self-check AD initial value is the sampling value obtained by the power polarity detector during power on self test, which saves energy and improves the efficiency compared with the subsequent starting of ADC sampling.

The initial value is 90V. On one aspect, because in the existing power socket specifications, an effective voltage value during power-on is at least 110V, in consideration with a measured value of the induction antenna, which is an instantaneous voltage, and a measurement error of the induction antenna itself, the initial value set to 90V can be applied to the detection of the 220V power socket of the national standard and the 110V power system of the U.S/ Japan.

Moreover, the electric field interference in the environment is eliminated by means of obtaining the self-check AD initial value, and the measurement stability and detection accuracy of the method are further improved.

The test plug of the power polarity detector is inserted into the detected power socket, a current value of the detection circuit is obtained through the Hall sensor, and it is determined whether the current value is greater than a preset current. The preset current is the current value when the test circuit is not charged, which is usually 0A.

If the current value is less than or equal to the preset current, the induction antenna samples the fire wire end of the detected power socket, and voltage information is obtained after conversion by the analogue-to-digital converter.

When the voltage information is greater than the preset threshold, it is determined that the neutral wire and the earth wire of the detected power socket are open, and the indicator light for indicating the opening of the neutral wire and the earth wire is switched on.

When it is determined whether the current value is greater than the preset current, the method further includes the following operations.

If the current value is greater than the preset current, the first MOS transistor switch and the third MOS transistor switch are controlled to be on, the fire wire test sub-circuit is sampled through the induction antenna, and a first comparison voltage is obtained after conversion by the analogue-to-digital converter.

The second MOS transistor switch is controlled to be on and the third MOS transistor switch is controlled to be off, the neutral wire test sub-circuit is sampled through the induction antenna, and a second comparison voltage is obtained after conversion by the analogue-to-digital converter.

When the second comparison voltage is greater than the first comparison voltage, it is determined that the neutral wire and the earth wire of the detected power socket are connected to the other's positions, and the indicator light for indicating that the neutral wire and the earth wire are connected to the other's positions is switched on.

Specifically, because the potential on the earth wire of the power socket is always zero, although its neutral wire is also earthed, the potential at the neutral wire end is not completely zero in practical applications due to humidity, distance and other reasons, and the greater the potential difference is, the greater the measured voltage is. Because the potential on the fire wire is certain, so the voltage between the fire wire end and the earth wire end of the detected power socket must be greater than the voltage between the fire wire end and the neutral wire end. Then, it can be concluded that the first comparison voltage must be greater than the second comparison voltage under normal conditions. Therefore, when it is determined whether the second comparison voltage is greater than the first comparison voltage, it can be determined that the neutral wire and the earth wire of the detected power socket are connected to each other's positions.

Furthermore, before it is determined whether the neutral wire and the earth wire of the detected power socket are connected to each other's positions, it is also necessary to determine that the detected power socket is connected with the fire wire, and the fire wire is connected to the correct position. In the present embodiment specifically, when the current state information is greater than the preset current, the following operations are required.

The detection circuit is driven to be disconnected from the fire wire end, the neutral wire end and the earth wire end of the detected power socket, and a first fire wire end voltage obtained by the induction antenna is received. The first fire wire end voltage is an induced voltage measured when the induction antenna is close to the fire wire end of the detected power socket.

It is determined whether the first fire wire end voltage is greater than a preset voltage which is 90V.

Then, the determination of whether the detected power socket is connected with the fire wire, and the fire wire is connected to the correct position is realized.

Through the method in cooperation with the socket detection apparatus, the anomaly detection of the earth wire and the neutral wire is completed automatically, and the detection on whether the power socket is in the state that there is only the fire wire, and is lack of the neutral wire and the earth wire, or the neutral wire and the earth wire are connected to each other's positions is realized. At the same time, the method is applicable to the power systems of 220V/50 Hz of the national standard, and 110V of the U.S./Japan. Moreover, the electric field interference in the environment is eliminated by means of obtaining the self-check AD initial value, and the measurement stability and detection accuracy of the method are further improved.

From the point of view of the micro-control unit, during measurement, a self-check instruction is sent, and the induction antenna runs without load, the test environment is sampled, the self-check AD initial value is obtained after conversion by the analogue-digital converter, and the preset threshold is calculated according to the formula: the preset threshold=the self-check AD initial value+the initial value (90V).

The test plug of the socket detection apparatus is inserted into the detected power socket, the current state information is obtained through the Hall sensor, and it is determined whether the current state information is greater than the preset current. When the current state information is less than or equal to the preset current, it is determined that the detection circuit of the power polarity detector is not charged, that is, the detected power socket does not form a loop through the power polarity detector; in this case, there may be a situation where the detected power socket is lack of the fire wire, or the detected power socket is lack of the neutral wire and the earth wire.

Through the cooperation of the knob and the telescoping mechanism, the induction antenna is driven to move to the second antenna guide slot, and the induction antenna is pushed to the fire wire connection end of the test plug to receive the voltage information corresponding to the fire wire end of the detected power socket. Then, it is determined whether the voltage information is greater than the preset threshold calculated above.

When the voltage information is greater than the preset threshold calculated above, a first alarm signal is generated, and the indicator light for indicating the opening of the neutral wire and the earth wire is driven by the first signal output end to be switched on.

When it is determined whether the current state information is greater than the preset current, if the current state information is greater than the preset current, third control information is output to control the first MOS transistor switch, the second MOS transistor switch and the third MOS transistor switch off, so that the detection circuit is disconnected from the fire wire end, the neutral wire end and the earth wire end of the detected power socket.

Through the cooperation of the knob and the telescoping mechanism, the induction antenna is driven to move to the second antenna guide slot to receive the first fire wire end voltage. It is further determined whether the first fire wire end voltage is greater than the preset voltage (90V), so as to realize the determination of whether the detected power socket is connected with the fire wire, and the fire wire is connected to the correct position.

When the first fire wire end voltage is greater than the preset voltage, the determination of whether the neutral wire and the earth wire of the detected power socket are connected to each other's positions is implemented, which includes that: fourth control information is output to control the first switch and the third switch on, so that the detection circuit is connected with the fire wire end and the earth wire of the power socket again; then, through the cooperation of the knob and the telescoping mechanism, the induction antenna is driven to move to the first antenna guide slot of the first circuit accommodating cavity, so that the induction antenna is close to the fire wire test sub-circuit, at this point, the induction antenna collects the voltage information through the electric field of the fire wire test sub-circuit as the first comparison voltage; moreover, the first comparison voltage obtained by the induction antenna is received and temporarily stored.

Furthermore, fifth control information is output to control the second switch on and the third switch off, so that the detection circuit is connected with the neutral wire end of the power socket again and the detection circuit is disconnected from the earth wire end of the detected power socket; then, through the cooperation of the knob and the telescoping mechanism, the induction antenna is driven to move to the second antenna guide slot of the first circuit accommodating cavity, so that the induction antenna is close to the neutral wire test sub-circuit, at this point, the induction antenna collects the voltage information through the electric field of the neutral wire test sub-circuit as the second comparison voltage; moreover, the second comparison voltage obtained by the induction antenna is received and temporarily stored.

It is determined whether the second comparison voltage is greater than the first comparison voltage; and when the second comparison voltage is greater than the first comparison voltage, a second alarm signal is generated, and the indicator light for indicating that the neutral wire and the earth wire are connected to the other's positions is driven by the second signal output end to be switched on.

When the voltage information corresponding to the fire wire end of the detected power socket, it is also needed to implement a filtering process which includes that: the induction antenna collects ten continuous instantaneous voltages of the fire wire end of the detected power socket and takes the instantaneous voltages as sinusoidal period information; after removing the maximum and minimum values in the ten continuous pieces of sinusoidal period information, the average value of the remaining eight pieces of sinusoidal period information is calculated, the average value is taken as the voltage information, and then it is determined whether the voltage information is greater than the preset threshold calculated above to achieve a filtering effect. At the same time, the filtering process is also applicable to collecting the first comparison voltage and the second comparison voltage.

Moreover, the filtering process may also be that: first, the maximum allowable deviation value (set as A) of two-time sampling performed by the induction antenna is determined, and the following determination is performed when a new sampling value is detected each time: if the difference between the current value and the last value is less than or equal to A, the current value is valid; if the difference between the current value and the last value is greater than A, the current value is invalid and the last value is used to replace the current value. The current value is taken as the voltage information. The advantage of the method is that a pulse interference caused by accidental factors can be overcome effectively. The filtering process may also be that: second, N consecutive sampling values of the induction antenna are taken (N is an odd number), the N sampling values are arranged in order of size, and the intermediate value is taken as the voltage information; and third, a queue, whose length is fixed as N, is generated according to the N consecutive sampling values of the induction antenna, a new datum is sampled through the induction antenna each time and put into the back of the queue, and the original datum at the head of the queue is discarded, and the N data in the queue is averaged arithmetically, and an operation value is taken as the voltage information. The advantage of the method is good suppression to external interference and high smoothness.

The structure design of the disclosure is reasonable and ingenious. Through the method for anomaly detection of the earth wire and the neutral wire and the socket detection apparatus, the anomaly detection of the earth wire and the neutral wire is completed automatically, and the detection on whether the power socket is in the state that there is only the fire wire, and is lack of neutral wire and earth wire, or the neutral wire and the earth wire are connected to the other's positions is realized. At the same time, the disclosure is applicable to power systems of 220V/50 Hz of the national standard, and 110V of the U.S./Japan. In addition to seven power socket states that the current socket detection apparatus can detect at most, the disclosure also supports the anomaly detection of the earth wire and the neutral wire of the power socket, which fills the market gap, and comprehensively guarantees the personal safety of personnel.

The above are only preferred embodiments of the disclosure and are not intended to limit the disclosure in any way. Any skilled in the art may use the technical means and technical contents disclosed above to make many possible changes and modifications, which are equivalent embodiments of the changes, without departing from the scope of the technical solutions of the disclosure. Therefore, all equivalent changes made according to the shape, structure and principle of the disclosure without departing from the content of the technical solution of the disclosure shall fall within the protection scope of the disclosure.

INDUSTRIAL APPLICABILITY

The structure design of the disclosure is reasonable and ingenious. Through the method for anomaly detection of the earth wire and the neutral wire and the socket detection apparatus, the anomaly detection of the earth wire and the neutral wire is completed automatically, and the detection on whether the power socket is in the state that there is only the fire wire, and is lack of neutral wire and earth wire, or the neutral wire and the earth wire are connected to the other's positions is realized. At the same time, the disclosure is applicable to power systems of 220V/50 Hz of the national standard, and 110V of the U.S./Japan. In addition to seven power socket states that the current socket detection apparatus can detect at most, the disclosure also supports the anomaly detection of the earth wire and the neutral wire of the power socket, which fills the market gap, and comprehensively guarantees the personal safety of personnel.

What is claimed is:

1. A socket detection apparatus for supporting anomaly detection of an earth wire and a neutral wire, comprising:
   a micro-control unit,
   a test plug provided with a fire wire connection end, a neutral wire connection end and an earth wire connection end, and
   a detection circuit connected with the test plug, wherein
   an induction antenna is arranged corresponding to a fire wire end of a detected power socket, and the induction antenna is connected with a first signal input end of the micro-control unit;
   the detection circuit comprises a fire wire test sub-circuit, a neutral wire test sub-circuit and an earth wire test sub-circuit respectively connected with the fire wire connection end, the neutral wire connection end and the earth wire connection end, and the fire wire test sub-circuit, the neutral wire test sub-circuit and the earth wire test sub-circuit are connected in turn to form a loop; and
   the fire wire test sub-circuit comprises a first light emitting diode, a first protective resistor and a first rectifier diode serially connected in turn; the positive electrode of the first light emitting diode is connected with the fire wire connection end, and the negative electrode of the first rectifier diode is connected with the earth wire test sub-circuit; the neutral wire test sub-circuit comprises a second rectifier diode, a second light emitting diode and a second protective resistor serially connected in turn; the positive electrode of the second rectifier diode is connected with the neutral wire connection end, and the input end of the first light emitting diode is also connected with the output end of the second protective resistor; the earth wire test sub-circuit comprises a third light emitting diode, a third protective resistor and a third rectifier diode serially connected in turn; the negative electrode of the third rectifier diode is connected with the earth wire connection end, and the positive electrode of the second rectifier diode is also connected with the positive electrode of the third light emitting diode.

2. The socket detection apparatus for supporting anomaly detection of an earth wire and a neutral wire as claimed in claim 1, wherein resistance values of the fire wire test sub-circuit, the neutral wire test sub-circuit and the earth wire test sub-circuit are the same.

3. The socket detection apparatus for supporting anomaly detection of an earth wire and a neutral wire as claimed in claim 1, wherein the induction antenna is connected with the first signal input end of the micro-control unit through a fourth protective resistor; and there is also an earthed signal attenuation resistor connected at the input end of the fourth protective resistor.

4. The socket detection apparatus for supporting anomaly detection of an earth wire and a neutral wire as claimed in claim 1, wherein a first signal output end of the micro-control unit is connected with an indicator light for indicating the opening of the neutral wire and the earth wire; and a second signal output end of the micro-control unit is connected with an indicator light for indicating that the neutral wire and the earth wire are connected to the other's positions.

5. The socket detection apparatus for supporting anomaly detection of an earth wire and a neutral wire as claimed in claim 1, wherein the fire wire test sub-circuit, the neutral wire test sub-circuit and the earth wire test sub-circuit are connected with the fire wire connection end, the neutral wire connection end and the earth wire connection end respectively through a first MOS transistor switch, a second MOS transistor switch and a third MOS transistor switch; and grid electrodes of the first MOS transistor switch, the second MOS transistor switch and the third MOS transistor switch are respectively connected with a first control output end, a second control output end and a third control output end of the micro-control unit.

6. The socket detection apparatus for supporting anomaly detection of an earth wire and a neutral wire as claimed in claim 1, further comprising: a Hall sensor arranged corresponding to the detection circuit, wherein the Hall sensor is connected with a second signal input end of the micro-control unit; and the induction antenna is also connected with an analogue-to-digital converter, which is connected with the first signal input end of the micro-control unit.

7. A method for anomaly detection of an earth wire and a neutral wire implemented by the socket detection apparatus for supporting anomaly detection of an earth wire and a neutral wire as claimed in claim 5, comprising:

presetting an initial value, sampling, by the induction antenna, a test environment, obtaining a self-check AD initial value after conversion by an analogue-to-digital converter, and adding the self-check AD initial value and the initial value to obtain a preset threshold;

inserting the test plug of a power polarity detector into the detected power socket, obtaining a current value of the detection circuit through a Hall sensor, and determining whether the current value is greater than a preset current;

if the current value is less than or equal to the preset current, sampling, by the induction antenna, the fire wire end of the detected power socket, and obtaining voltage information after conversion by the analogue-to-digital converter;

when the voltage information is greater than the preset threshold, determining that the neutral wire and the earth wire of the detected power socket are open, and switching on an indicator light for indicating the opening of the neutral wire and the earth wire.

8. The method for anomaly detection of an earth wire and a neutral wire according to claim 7, wherein when determining whether the current value is greater than the preset current, the method further comprises:

if the current value is greater than the preset current, controlling the first MOS transistor switch and the third MOS transistor switch to be on, sampling the fire wire test sub-circuit through the induction antenna, and obtaining a first comparison voltage after conversion by the analogue-to-digital converter;

controlling the second MOS transistor switch to be on and controlling the third MOS transistor switch to be off, sampling the neutral wire test sub-circuit through the induction antenna, and obtaining a second comparison voltage after conversion by the analogue-to-digital converter; and when the second comparison voltage is greater than the first comparison voltage, determining that the neutral wire and the earth wire of the detected power socket are connected to the other's positions, and switching on the indicator light for indicating that the neutral wire and the earth wire are connected to the other's positions.

\* \* \* \* \*